United States Patent
Srinivas et al.

(10) Patent No.: US 10,459,510 B1
(45) Date of Patent: Oct. 29, 2019

(54) POWER CHAIN WITH DELAY ADAPTIVE SWITCHES

(71) Applicant: QUALCOMM Incorporated, San Diego, CA (US)

(72) Inventors: Raghavendra Srinivas, Blacksburg, VA (US); Uday Shankar Mudigonda, Bengaluru (IN); Giby Samson, San Diego, CA (US); Ramaprasath Vilangudipitchai, San Diego, CA (US); Dorav Kumar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/250,953

(22) Filed: Jan. 17, 2019

(51) Int. Cl.
| | |
|---|---|
| *H03K 19/00* | (2006.01) |
| *H03K 17/28* | (2006.01) |
| *G06F 1/32* | (2019.01) |
| *G06F 1/3234* | (2019.01) |
| *H03K 17/693* | (2006.01) |
| *H03K 17/284* | (2006.01) |

(52) U.S. Cl.
CPC ......... *G06F 1/3243* (2013.01); *H03K 17/284* (2013.01); *H03K 17/693* (2013.01); *H03K 19/0016* (2013.01)

(58) Field of Classification Search
CPC .... H03K 17/693; H03K 17/785; H03K 17/80; H03K 17/81; H03K 17/26; H03K 17/28; H03K 17/284; H03K 17/16; H03K 17/161; H03K 17/165; H03K 17/166; H03K 17/167; H03K 19/0016; H03K 19/00361; H03K 19/0008; H03K 19/0013
See application file for complete search history.

(56) References Cited

U.S. PATENT DOCUMENTS

| | | | |
|---|---|---|---|
| 8,327,163 B2 | 12/2012 | Chen et al. | |
| 9,013,851 B2 | 4/2015 | Kidd et al. | |
| 9,337,825 B2 | 5/2016 | Takayanagi et al. | |
| 9,654,101 B2 | 5/2017 | Cao et al. | |
| 9,852,859 B2 * | 12/2017 | Cao .................... | H03K 19/0008 |
| 2015/0153818 A1 * | 6/2015 | Jeon ...................... | G06F 1/3243 |
| | | | 713/323 |
| 2018/0253129 A1 | 9/2018 | Singh et al. | |

* cited by examiner

*Primary Examiner* — An T Luu
(74) *Attorney, Agent, or Firm* — Loza & Loza, LLP/Qualcomm

(57) ABSTRACT

In certain aspects, an apparatus includes a first plurality of power switch devices. Each of the first plurality of power switch devices includes a delay line having a programmable time delay, and a power switch coupled between a supply rail and a circuit block, wherein the power switch has a control input coupled to the delay line. The apparatus also includes a switch manager configured to program the time delays of the delay lines in the first plurality of power switch devices based on a number of active circuit blocks in a system.

21 Claims, 7 Drawing Sheets

POWER CHAIN WITH DELAY ADAPTIVE SWITCHES

BACKGROUND

Field

Aspects of the present disclosure relate generally to power switches, and more particularly, to power switches with programmable delays.

Background

A system may include multiple circuit blocks (e.g., processor cores) that share a power supply rail. The system may also include power switches that allow the circuit blocks to be individually power collapsed to conserve power (e.g., reduce power leakage). For example, when a particular circuit block is not in use, the circuit block may be power collapsed to conserve power.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a first plurality of power switch devices. Each of the first plurality of power switch devices includes a delay line having a programmable time delay, and a power switch coupled between a supply rail and a circuit block, wherein the power switch has a control input coupled to the delay line. The apparatus also includes a switch manager configured to program the time delays of the delay lines in the first plurality of power switch devices based on a number of active circuit blocks in a system.

A second aspect relates to a method for programming power switch delays in a system. The system includes a plurality of power switch devices, each of the plurality of power switch devices including a delay line having a programmable time delay and a power switch coupled between a supply rail and a circuit block, wherein the power switch has a control input coupled to the delay line. The method includes tracking a number of active circuit blocks in the system, and programming the time delays of the delay lines in the plurality of power switch devices based on the tracked number of active circuit blocks.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
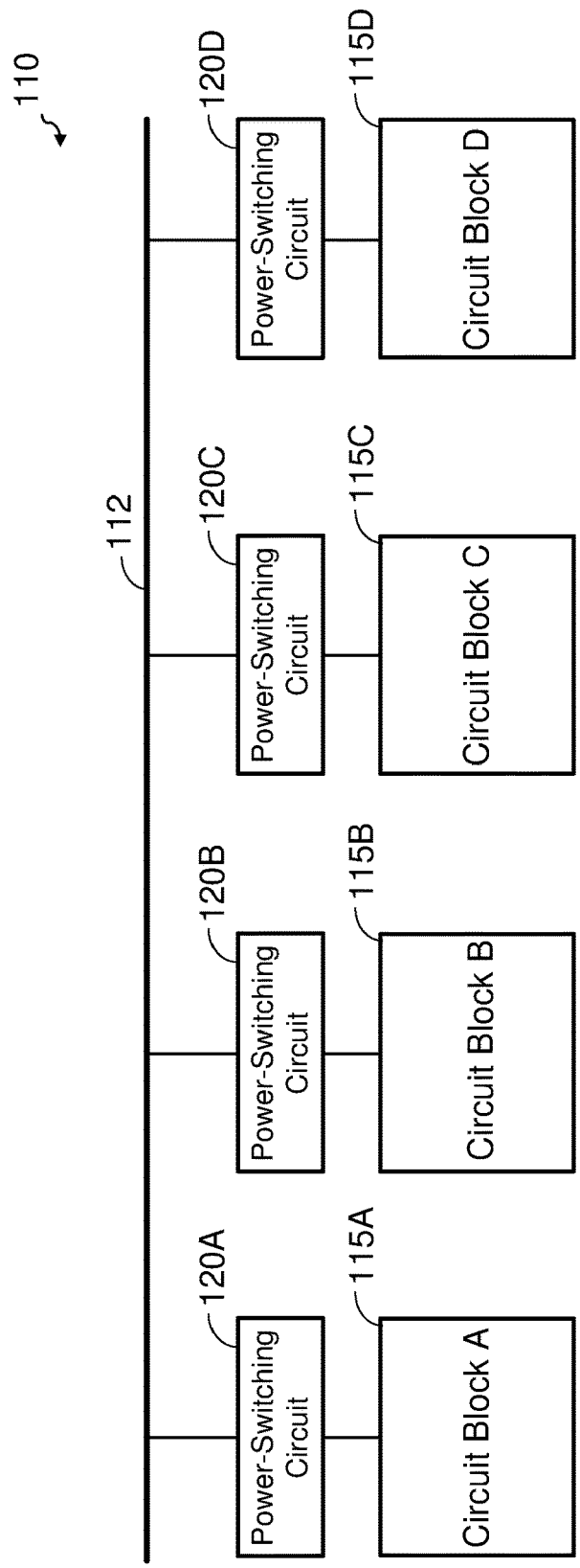
FIG. 1 shows an example of a system including multiple circuit blocks that share a supply rail according to certain aspects of the present disclosure.

FIG. 1 shows an example of a system 110 including multiple circuit blocks 115A to 115D that share a power supply rail 112. For each of the circuit blocks 115A to 115D, the system 110 includes a respective power-switching circuit 120A to 120D coupled between the shared power supply rail 112 and the circuit block for controlling power to the circuit block. The power-switching circuits 120A to 120D allow the circuit blocks 115A to 115D to be individually power gated to conserve power (e.g., reduce power leakage). For example, when a particular circuit block is not in use, the circuit block may be power collapsed to conserve power by turning off power switches in the respective power-switching circuit. Thus, the power-switching circuits 120A to 120D allow one or more circuit blocks to be power collapsed while one or more of the other circuit blocks are active.

In certain aspects, the circuit blocks 115A to 115D and the power-switching circuits 120A to 120D are integrated on the same chip (i.e., die). In one example, the supply voltage on the shared supply rail 112 is provided by an off-chip power management integrated circuit (PMIC). Although four circuit blocks are shown in the example in FIG. 1, it is to be appreciated that the system 110 may have a different number of block circuits that are individually power gated.

In certain aspects, the system 110 may be a multi-core system, and each of the circuit blocks 115A to 115D may include a respective processor core. The processor cores may be configured to read and execute instructions in parallel. In these aspects, the number of processor cores that are power collapsed by the power-switching circuits 120A to 120D may vary over time (e.g., depending on the processing needs of application(s) running on the system 110).

Figure 2:
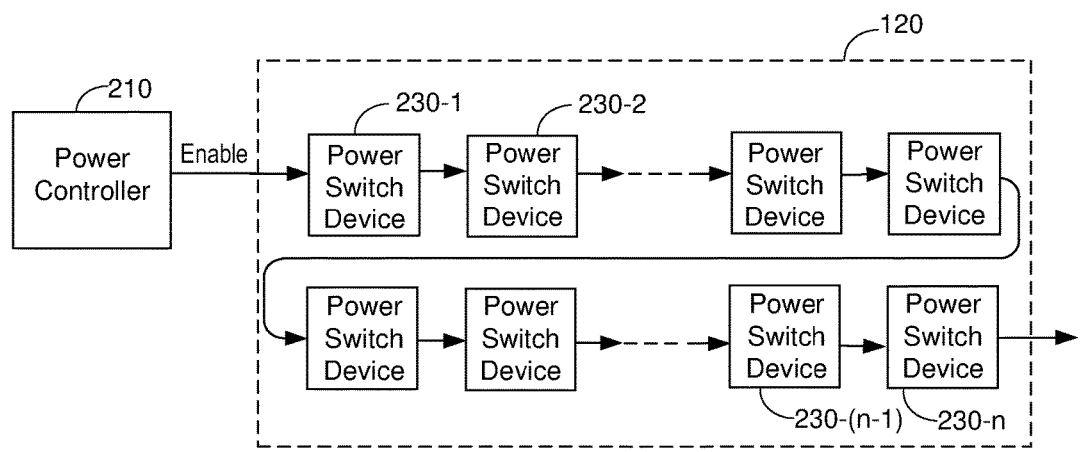
FIG. 2 shows an example of power switch devices coupled in a daisy chain according to certain aspects of the present disclosure.

FIG. 2 shows an example of the power-switching circuit 120 for one of the circuit blocks 115A to 115D. In this example, the power-switching circuit 120 includes power switch devices 230-1 to 230-n (also referred to as head switch cells) coupled in a daisy chain (also referred to as a power chain). The power switch devices 230-1 to 230-n may number in the thousands. As discussed further below, each of the power switch devices 230-1 to 230-n includes a power switch coupled between the shared rail 112 and the respective circuit block (not shown in FIG. 2). When a power switch device is turned on, the power switch in the power switch device is turned on (i.e., closed). When a power switch device is turned off, the power switch in the power switch device is turned off (i.e., opened).

In this example, a power controller 210 controls power to the respective circuit block (e.g., processor core) by controlling the power switch devices 230-1 to 230-n. To power collapse the respective circuit block, the power controller 210 turns off the power switch devices 230-1 to 230-n. In this case, the power switches in the power switch devices 230-1 to 230-n are turned off, which decouples the shared supply rail 112 from the respective circuit block.

To wake up (i.e., power-up) the respective circuit block from the power collapsed mode, the power controller 210 outputs an enable signal to the input of the first power switch device 230-1 in the daisy chain. The enable signal turns on the power switch devices 230-1 to 230-n one by one (i.e., sequentially) as the enable signal propagates through the daisy chain. The delays between the turn-on times of the power switch devices 230-1 to 230-n depend on the delays in the power switch devices 230-1 to 230-n, as discussed further below. The output of the last power switch device 230-n may be coupled to the power controller 210. In this example, the last power switch device 230-n outputs the enable signal to the power controller 210 after the enable signal has propagated through the entire daisy chain, signaling to the power controller 210 that all of the power switch devices 230-1 to 230-n have been turned on.

The power switch devices 230-1 to 230-n are turned on sequentially to manage inrush current during power-up of the respective circuit block (e.g., processor core). If all of the power switches device 230-1 to 230-n were turned on at once at the start of power-up, then a large inrush current would flow from the shared supply rail 112 to the respective circuit block to charge up capacitors in the circuit block (which may be fully discharged at the start of power-up). The large inrush current may damage the system 110 and/or cause a large voltage droop on the shared supply rail 112. If one or more of the other circuit blocks are active, then the large voltage droop may negatively impact the operations of the one or more other circuit blocks. Sequentially turning on the power switch devices 230-1 to 230-n causes the conductance between the shared supply rail 112 and the respective circuit block to gradually increase, which limits inrush current at the start of power-up.

Figure 3:
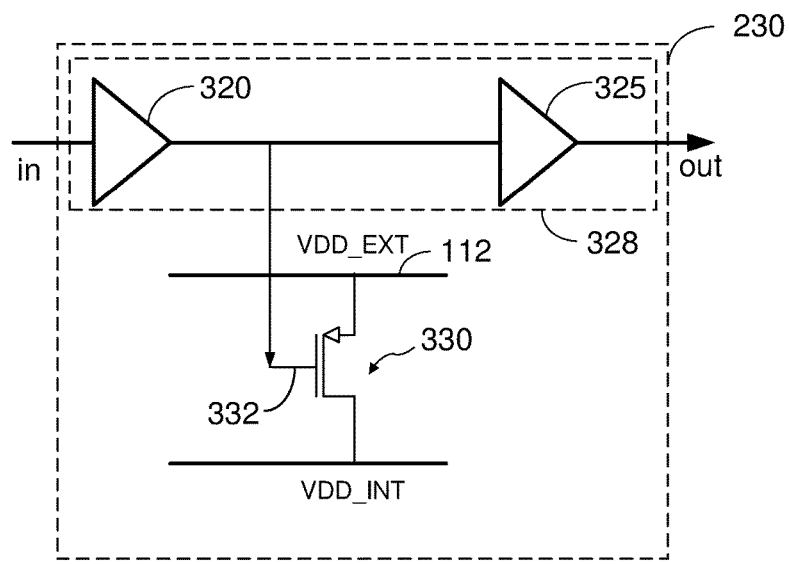
FIG. 3 shows an example of a power switch device according to certain aspects of the present disclosure.

FIG. 3 shows an exemplary implementation of a power switch device 230. Each of the power switch devices 230-1 to 230-n shown in FIG. 2 may be implemented with the power switch device 230 (i.e., each of the power switch devices 230-1 to 230-n may be a separate instance of the power switch device 230 in FIG. 3). The power switch device 230 includes a delay line 328 having a non-programmable delay. The power switch device 230 also includes a power switch 330 coupled between the shared supply rail 112 (labeled "VDD_EXT") and an internal rail (labeled "VDD_INT") of the respective circuit block (not shown in FIG. 3).

The power switch 330 has a control input 332 coupled to the delay line 328. The control input 332 is used to control whether the power switch 330 is turned on (i.e., closed) or turned off (i.e., open). As discussed further below, when an enable signal on the delay line 328 is input to the control input 332, the power switch 330 is turned on. When a disable signal on the delay line 328 is input to the control input 332, the power switch is turned off. In the example in FIG. 3, the power switch 330 is implemented with a power transistor (e.g., p-type field effect transistor (PFET)), in which the control input 332 of the power switch comprises the gate of the transistor. In the case of a PFET, the enable signal has a logic value of zero, and the disable signal has a logic value of one.

The delay line 328 is coupled between the input (labeled "in") and the output (labeled "out") of the power switch device 230, and may include one or more delay buffers. In the example in FIG. 3, the delay line 328 includes two delay buffers 320 and 325 (e.g., inverters) coupled in series between the input and the output of the power switch device 230. The delay buffers 320 and 325 have non-programmable delays, as discussed further below. The input of the power switch device 230 may be coupled to the output of a previous power switch device in the daisy chain, and the output of the power switch device 230 may be coupled to the input of a next power switch device in the daisy chain. In this regard, the delay lines of the power switch devices 230-1 to 230-n are coupled in series to form the daisy chain. During power-up, the enable signal propagates through the daisy chain by propagating down the series-coupled delay lines of the power switch devices 230-1 to 230-n.

For the example in which the power switch 330 is implemented with a power PFET, the gate of the power PFET is coupled to the delay line 328, the source of the power PFET is coupled to the shared supply rail 112, and the drain of the power PFET is coupled to the internal rail of the respective circuit block. Although FIG. 3 shows an example of one power transistor, it is to be appreciated that the power switch 330 may be implemented with multiple power transistors coupled in parallel.

During power-up, the power switch device 230 receives the enable signal at the input of the power switch device 230 from the previous power switch device in the daisy chain. The enable signal then propagates down the delay line 328 to the output of the power switch device 230. The enable signal is also input to the control input 332 of the power switch (which is coupled to the delay line 328). The enable signal turns on the power switch 330 in the power switch device 230. The delay buffers 320 and 325 in the delay line 328 delay the enable signal by a fixed delay. After the delay, the enable signal is output to the next power switch device in the daisy chain. Thus, in this example, the delays between the turn-on times of the power switches in the power switch devices 230-1 to 230-n depend on the time delays of the delay buffers in the power switch devices 230-1 to 230-n.

In current systems, the delays in the power switch devices 230-1 to 230-n are fixed. As discussed further below, a drawback with using fixed delays is that the wake-up time of the respective circuit block may not be optimized for different use cases.

When a circuit block (e.g., any one of circuit blocks 115A to 115D) wakes up from the power collapsed mode, the inrush current management capability of the system 110 depends on the number of circuit blocks in the system 110 that are already active. Higher the number of circuit blocks in the system 110 that are already active, higher is the inrush current management capability of the system 110. This is because capacitors (or inherit capacitance of charged standard cell logic) in the active circuit blocks (e.g., processor cores) provide additional upstream capacitance for charging up the capacitors (standard cell logic) in the circuit block (e.g., processor core) that is being woken up (i.e., powered up). The higher inrush current management capability allows the wake-up time (i.e., wake-up latency) of the circuit block being woken up to be reduced for better performance (e.g., faster wake up) while still staying within acceptable inrush current limits.

Using fixed delays in the power switch devices 230-1 to 230-$n$ causes the wake-up time (i.e., wake-up latency) of the respective circuit block to be fixed. The wake-up time may be chosen during the design phase of the system 110 to manage inrush current for the worst use case (e.g., all of the other circuit blocks in the system 110 are power collapsed). Thus, in this example, the wake-up time of the circuit block is dictated by the worst use case. Because the wake-up time is fixed based on the worst use case, the wake-up time of the circuit block cannot be dynamically reduced during operation when one or more other circuit blocks in the system 110 are already active. As a result, in cases where one or more other circuit blocks in the system 110 are already active, the wake-up time of the circuit block is longer than needed to manage inrush current, resulting in lower performance (e.g., slower wake up).

To address the above drawback, aspects of the present disclosure provide power switch devices with programmable delays that allow the wake-up time of a circuit block (e.g., processor core) to be dynamically controlled based on the number of active circuit blocks (e.g., processor cores) in a system, as discussed further below.

Figure 4:
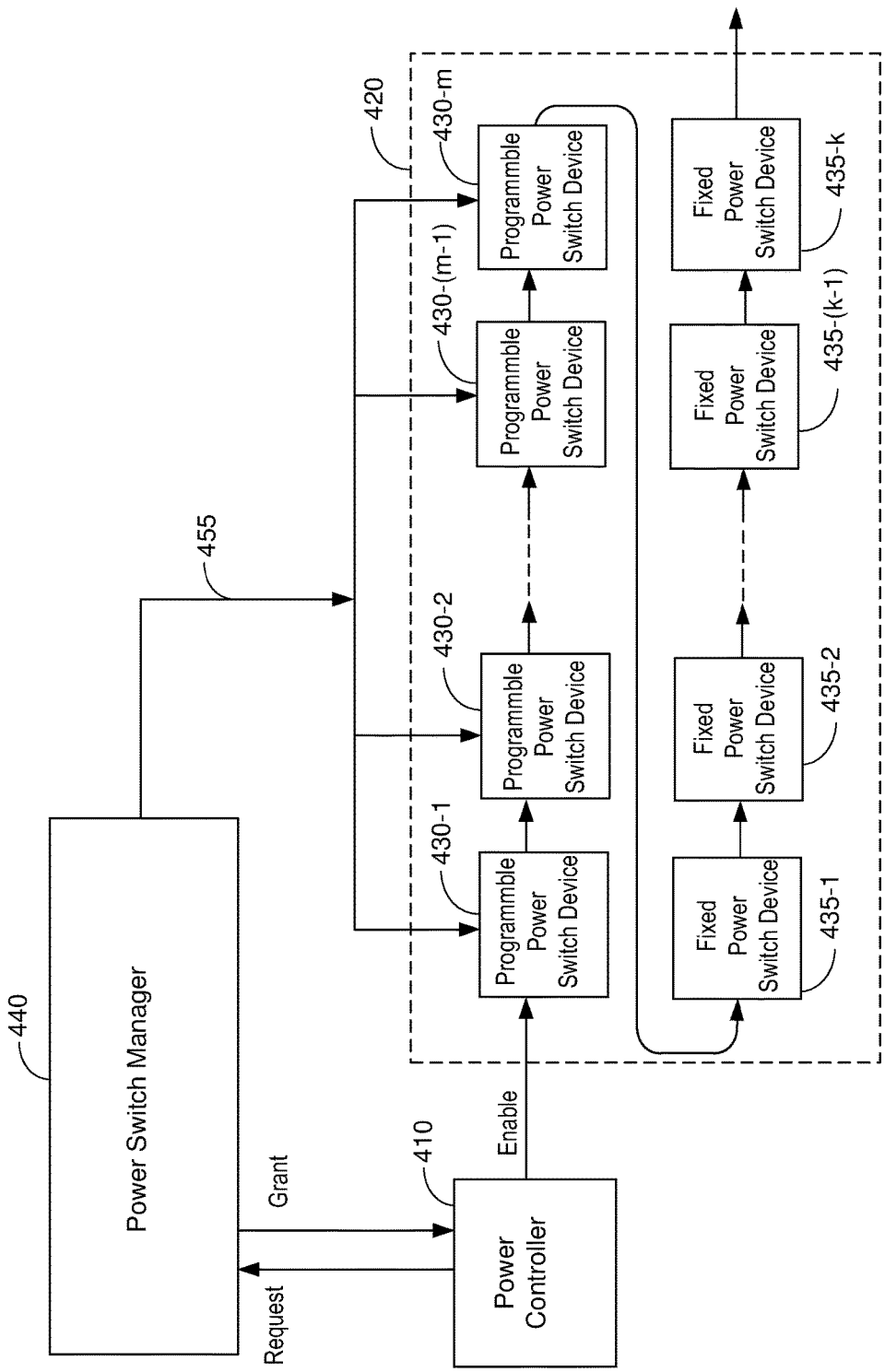
FIG. 4 shows an example of a power-switching circuit including power switch devices with programmable time delays according to certain aspects of the present disclosure.

FIG. 4 shows an example of a power-switching circuit 420 for controlling power to one of the circuit blocks 115A to 115D in the system 110. In this regard, the power-switching circuit 420 may be used to implement one of the power-switching circuits 120A to 120D shown in FIG. 1. As discussed further below, the power-switching circuit 420 allows the wake-up time of the respective circuit block to be programmed (i.e., adjusted) based on the number of active circuit blocks in the system 110. As used herein, a circuit block may be considered active when the circuit block is coupled to the shared supply 112 by the respective power-switching circuit 420.

In this example, the power-switching circuit 420 includes programmable power switch devices 430-1 to 430-$m$ and fixed power switch devices 435-1 to 435-$k$ for controlling power to the respective circuit block. Each of the programmable power switch devices 430-1 to 430-$m$ has a programmable (i.e., adjustable) time delay that is controlled by a control signal 455, as discussed further below. Each of the fixed power switch devices 435-1 to 435-$k$ has a non-programmable time delay, and may be implemented using the exemplary power switch device 230 shown in FIG. 2. The fixed delay in the fixed power switch devices 435-1 to 435-$k$ can be shorter compared to that of the programmable power switch devices 430-1 to 430-$m$ because the programmable delay in the initial programmable switch devices 430-1 to 430-$m$ can handle most of the inrush current. The number of such programmable switch devices and fixed delay switch devices in the chain can be determined optimally with power delivery network (PDN) simulations during development phase. This approach allows better trade-off between performance, routing and area as programmable switch devices consume relatively more area and also require additional routing of control signal 455.

The programmable power switch devices 430-1 to 430-$m$ and the fixed power switch devices 435-1 to 435-$k$ are coupled in a daisy chain, in which the programmable power switch devices 430-1 to 430-$m$ precede the fixed power switch devices 435-1 to 435-$k$ in the daisy chain. As a result, during power-up of the respective circuit block, the programmable power switch devices 430-1 to 430-$m$ are turned on before the fixed power switch devices 435-1 to 435-$k$. The programmable power switch devices 430-1 to 430-$m$ precede the fixed power switch devices 435-1 to 435-$k$ because a significant portion of the inrush current is handled by initial switches, where a higher buffer delay may be needed for worst case and this delay can be reduced if there are already active circuit blocks. The programmable power switch devices 430-1 to 430-$m$ allow the wake-up time of the respective circuit block to be programmed by programming the delays of the programmable power switch devices 430-1 to 430-$m$, as discussed further below.

The system 110 also includes a power switch manager 440 that manages the wake-up times of the circuit blocks in the system 110 based on the number of active circuit blocks in the system 110, as discussed further below. In one example, the power switch manager 440 is configured to track the number of active circuit blocks in the system 110 (referred to as the active count below). In this regard, the power switch manager 440 may increment the active count when a circuit block in the system 110 is powered up, and decrement the active count when a circuit block in the system 110 is power collapsed.

In operation, when the circuit block corresponding to the power-switching circuit 420 is to be woken up (i.e., powered up) from the power collapsed mode, the respective power controller 410 sends a power-up request to the power switch manager 440. In response to the request, the power switch manager 440 programs the delays of the programmable power switch devices 430-1 to 430-$m$ in the power-switching circuit 420 based on the current active count. For example, the power switch manager 440 may program the delays of the programmable power switch devices 430-1 to 430-$m$ to be shorter for a higher active count and longer for a lower active count.

The power switch manager 440 also sends a grant to the power controller 410 to start power-up of the respective circuit block. In response to the grant, the power controller 210 outputs an enable signal to the first programmable power switch device 430-1 in the daisy chain to initiate power-up of the respective circuit block. The enable signal sequentially turns on the power switch devices 430-1 to 430-$m$ and 435-1 to 435-$k$ as the enable signal propagates through the daisy chain. The programmable power switch devices 430-1 to 430-$m$ are turned on before the fixed power switch devices 435-1 to 435-$k$ since the programmable power switch device 430-1 to 430-$m$ precede the fixed power switch devices 435-1 to 435-$k$ in the daisy chain.

The delays of the programmable power switch devices 430-1 to 430-$m$ can be controlled to optimize the wake-up time of the respective circuit block. The shorter the delays, the shorter the wake-up time of the circuit block. Thus, the power switch manager 440 is able to dynamically control the wake-up time of the respective circuit block based on the active count by programming the delays of the programmable power switch devices 430-1 to 430-$m$ based on the active count. In this regard, the power switch manager 440 may program shorter delays (and hence a shorter wake-up time) for a higher active count, and program longer delays (and hence a longer wake-up time) for a lower active count.

As discussed above, the inrush current management capability of the system 110 is higher when the number of active circuit blocks in the system 110 is higher (i.e., the active count is higher). This allows the power switch manager 440 to program shorter delays for the programmable power switch devices 430-1 to 430-$m$ (and hence program a shorter wake-up time for the respective circuit block) when the active count is higher while staying within acceptable inrush current limits. Thus, for cases where one or more circuit blocks in the system 110 are already active, the power switch manager 440 is able to reduce the wake-up time for the respective circuit block to achieve higher performance (e.g., faster wake up). The lower wake-up time (i.e., latency) may encourage power management software (e.g., operating system 'IDLE thread') and/or hardware to use the power collapse mode more frequently for a larger number of applications to provide improved days of usage (DoU).

Figure 5:
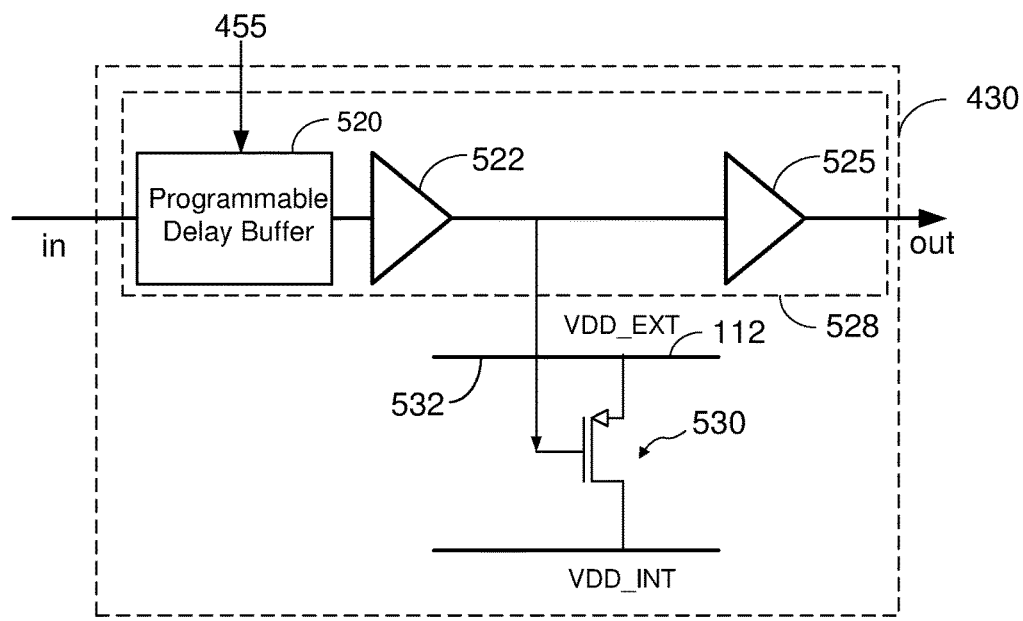
FIG. 5 shows an example of a power switch device including a programmable delay buffer according to certain aspects of the present disclosure.

FIG. 5 shows an exemplary implementation of a programmable power switch device 430 according to certain aspects of the present disclosure. Each of the programmable power switch devices 430-1 to 430-$m$ in FIG. 4 may be implemented with the programmable power switch device 430 (i.e., each of the programmable power switch devices 430-1 to 430-$m$ may be a separate instance of the programmable power switch device 430 in FIG. 5).

The programmable power switch device 430 includes a delay line 528 having a programmable (i.e., adjustable) time delay. In certain aspects, the power switch manager 440 programs the time delay of the delay line 528 using a control signal 455 input to the delay line 528. For example, the power switch manager 440 may be configured to program the time delay of the delay line 528 to be equal to a first delay if the number of active circuit blocks is equal to a first number, and program the time delay of the delay line 528 to be equal to a second delay if the number of active blocks is equal to a second number. In this example, the first delay is shorter than the second delay, and the first number is higher than the second number.

The programmable power switch device 430 also includes a power switch 530 coupled between the shared supply rail 112 (labeled "VDD_EXT") and an internal rail (labeled "VDD_INT") of the respective circuit block (not shown in FIG. 5). The power switch 530 has a control input 532 coupled to the delay line 528. The control input 532 is used to control whether the power switch 530 is turned on (i.e., closed) or turned off (i.e., open). As discussed further below, when an enable signal on the delay line 528 is input to the control input 532, the power switch 530 is turned on. When a disable signal on the delay line 528 is input to the control input 532, the power switch is turned off. In the example in FIG. 5, the power switch 530 is implemented with a power transistor (e.g., p-type field effect transistor (PFET)), in which the control input 532 of the power switch comprises the gate of the transistor. In the case of a PFET, the enable signal has a logic value of zero, and the disable signal has a logic value of one. Although one power transistor is shown in the example in FIG. 5, it is to be appreciated that the power switch 530 may include multiple power transistors coupled in parallel between the shared supply rail 112 and the internal rail of the respective circuit block.

The delay line 528 is coupled between the input (labeled "in") and the output (labeled "out") of the programmable power switch device 430. The delay line 528 includes a programmable delay buffer 520 with a programmable time delay controlled by the control signal 455 from the power switch manager 440. The delay line 528 may also include one or more fixed delay buffers 522 and 525 (e.g., inverters) coupled in series, as shown in FIG. 5. In this example, the programmable delay buffer 520 provides the programmability of the time delay of the delay line 528. Thus, in this example, the power switch manager programs the time delay of the delay line 528 by programming the delay of the programmable delay buffer 520.

In certain aspects, the programmable delay buffer 520 has multiple delay settings, in which each delay setting corresponds to a different time delay. In one example, the control signal 455 may be a digital control signal, in which the digital value of the digital control signal indicates one of the delay settings (and hence one of the corresponding time delays). In this example, the programmable delay buffer 520 sets its delay to the delay setting (and hence the corresponding time delay) indicated by the value of the digital control signal. Thus, in this example, the power switch manager 440 programs the delay of the programmable power switch device 430 by setting the value of the control signal 455 according to the desired delay.

Alternatively, the programmable delay buffer 520 may have a continuously adjustable delay within a certain range. In one example, the delay of the programmable delay buffer 520 may be controlled by a parameter (e.g., voltage level) of the control signal 455. Thus, in this example, the power switch manager 440 programs the delay of the programmable power switch device 430 by setting the parameter (e.g., voltage level) of the control signal 455 according to the desired delay.

The input of the programmable power switch device 430 may be coupled to the output of a previous power switch device in the daisy chain, and the output of the power switch device 430 may be coupled to the input of a next power switch device in the daisy chain. In this regard, the delay lines 528 and 328 of the power switch devices 430-1 to 430-$m$ and 435-1 to 435-$k$, respectively, are coupled in series to form the daisy chain.

For the example in which the power switch 530 is implemented with one or more power PFETs, the gate of each power PFET is coupled to the delay line 528, the source of each power PFET is coupled to the shared supply rail 112, and the drain of each power PFET is coupled to the internal rail of the respective circuit block. The gate of each power PFET may be coupled to the delay line 528 at any point along the delay line 528.

Figure 6:
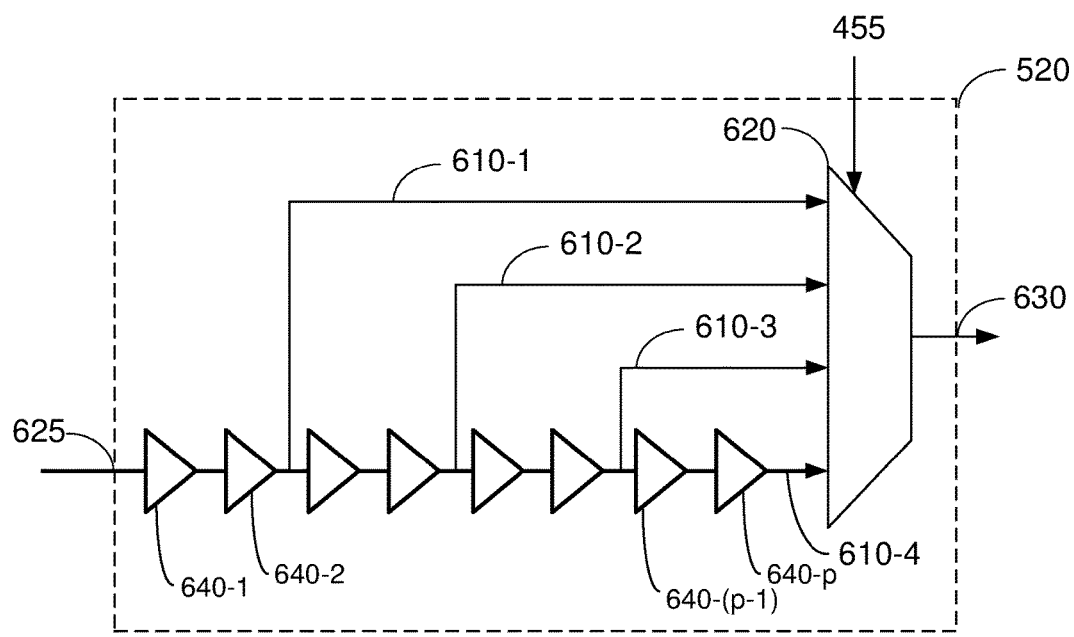
FIG. 6 shows an exemplary implementation of a programmable delay buffer according to certain aspects of the present disclosure.

During power-up of the respective circuit block (e.g., respective one of the circuit blocks 115A to 115D), the programmable power switch device 430 receives the enable signal at the input of the power switch device 430 from the previous power switch device in the daisy chain. The enables signal then propagates down the delay line 528 to the output of the power switch device 430. The enable signal is also input to the control input 532 of the power switch 530 (which is coupled to the delay line 528). The enable signal turns on the power switch 530 in the power switch device 430. The programmable delay buffer 520 delays the enable signal by the delay programmed by the control signal 455. After the delay of the delay line 528, the power switch device 430 outputs the enable signal to the next power switch device in the daisy chain. For the example in which the delay line 528 includes one or more fixed delay buffers 522 and 525, the total delay of the delay line 528 includes the programmable delay of the programmable delay buffer 520 and the delays of the one or more fixed delay buffers 522 and 525. The total delay of delay line 528 per power switch device 430-1 to 430-$m$ may be equal to delay of delay line 328 per power switch device 230 for the worst case (i.e., no active circuit blocks) and for cases when active count increases, the total delay of delay line 528 may be less than that of power switch 230. In this way, latency is reduced/optimized to improve the performance by taking advantage of dynamic increase in upstream capacitance with increase in active count FIG. 6 shows an exemplary implementation of the programmable delay buffer 520 according to certain aspects of the present disclosure. In this example, the programmable delay buffer 520 includes multiple delay paths 610-1 to 610-4, in which each of the delay paths 610-1 to 610-4 has a different time delay. The different time delays are achieved by including a different number of delay buffers 640-1 to 640-$p$ in each of the delay paths 610-1 to 610-4, as shown in FIG. 6. In the example in FIG. 6, delay path 610-1 (which has the shortest delay) includes two of the delay buffers 640-1 and 640-2, and delay path 610-4 (which has the longest delay) includes all of the delay buffers 640-1 to 640-$p$. The delay buffers 640-1 to 640-$p$ may have the same delays or different delays.

The programmable delay buffer 520 also includes a multiplexer 620 having multiple inputs and one output. Each of the delay paths 610-1 to 610-4 is coupled between the input 625 of the programmable delay buffer 520 and a respective one of the inputs of the multiplexer 620. The output of the multiplexer 620 is coupled to the output 630 of the programmable delay buffer 520. The multiplexer 620 is configured to selects one of the delay paths 610-1 to 610-4 based on the control signal 455, and couple the selected delay path to the output 630 of the programmable delay buffer 520. Thus, in this example, the control signal 455 controls the delay of the programmable delay buffer 520 by controlling which one of the delay paths 610-1 to 610-4 is selected by the multiplexer 620. When the enable signal is received at the input 625 of the programmable delay buffer 520, the programmable delay buffer 520 outputs the enable signal at the output 630 after the time delay corresponding to the selected delay path.

In the example in FIG. 6, the programmable delay buffer 520 includes four delay paths 610-1 to 610-4. Thus, in this example, the power switch manager 440 can program the delay of the programmable delay buffer 520 to any one of the four different delays corresponding to the delay paths 610-1 to 610-4. For example, the power switch manager 440 may program the multiplexer 620 to select delay path 610-4 (i.e., the delay path with the longest delay) if the current active count is zero, program the multiplexer 620 to select delay path 610-3 if the current active count is one, program the multiplexer 620 to select delay path 610-2 if the active count is two, and program the multiplexer 620 to select delay path 610-1 (the delay path with the shortest delay) if the current active count is three.

In certain aspects, the power switch manager 440 may program the delay of the programmable delay buffer 520 by inputting the current active count directly to the programmable delay buffer 520 as the control signal 455. In these aspects, the multiplexer 620 may be configured to select delay path 610-4 if the current active count is zero, select delay path 610-3 if the current active count is one, select delay path 610-2 if the current active count is two, and select delay path 610-1 if the current active count is three. Although four delay paths 610-1 to 610-4 are shown in the example in FIG. 6, it is to be appreciated that the present disclosure is not limited to this example.

In the example in FIG. 4, the power-switching circuit 420 includes a mix of programmable power switch devices 430-1 to 430-$m$ and fixed power switch devices 435-1 to 435-$k$. The programmable power switch devices 430-1 to 430-$m$ are positioned before the fixed power switch devices 435-1 to 435-$k$ in the daisy chain to provide inrush current management at the beginning of power-up. The risk of a large inrush current is usually greatest at the beginning of power-up since the voltage difference between the supply rail 112 and the internal rail of the respective circuit block is greatest at the beginning of power-up. As the voltage on the internal rail rises during power-up, the risk of a large inrush current diminishes.

In the above example, the programmable power switch devices 430-1 to 430-$m$ provide programmability to the wake-up time of the respective circuit block and inrush current management. The fixed power switch devices 435-1 to 435-$k$ help with reducing the overall size of the power-switching circuit 420. This is because the fixed power switch devices 435-1 to 435-$k$ do not include programmable delay buffers which may be larger than fixed delay buffers. Thus, the number of programmable power switch devices 430-1 to 430-$m$ and the number of fixed power switch devices 435-1 to 435-$k$ in the power-switching circuit 420 may be selected based on a trade-off between chip area, optimal wake-up time and inrush management.

Although the power-switching circuit 420 includes a mix of programmable power switch devices 430-1 to 430-$m$ and fixed power switch devices 435-1 to 435-$k$ in the example in FIG. 4, it is to be appreciated that the power-switching circuit 420 is not limited to this example. For example, the power-switching circuit 420 may be implemented with all programmable power switch devices coupled in a daisy chain.

Figure 7:
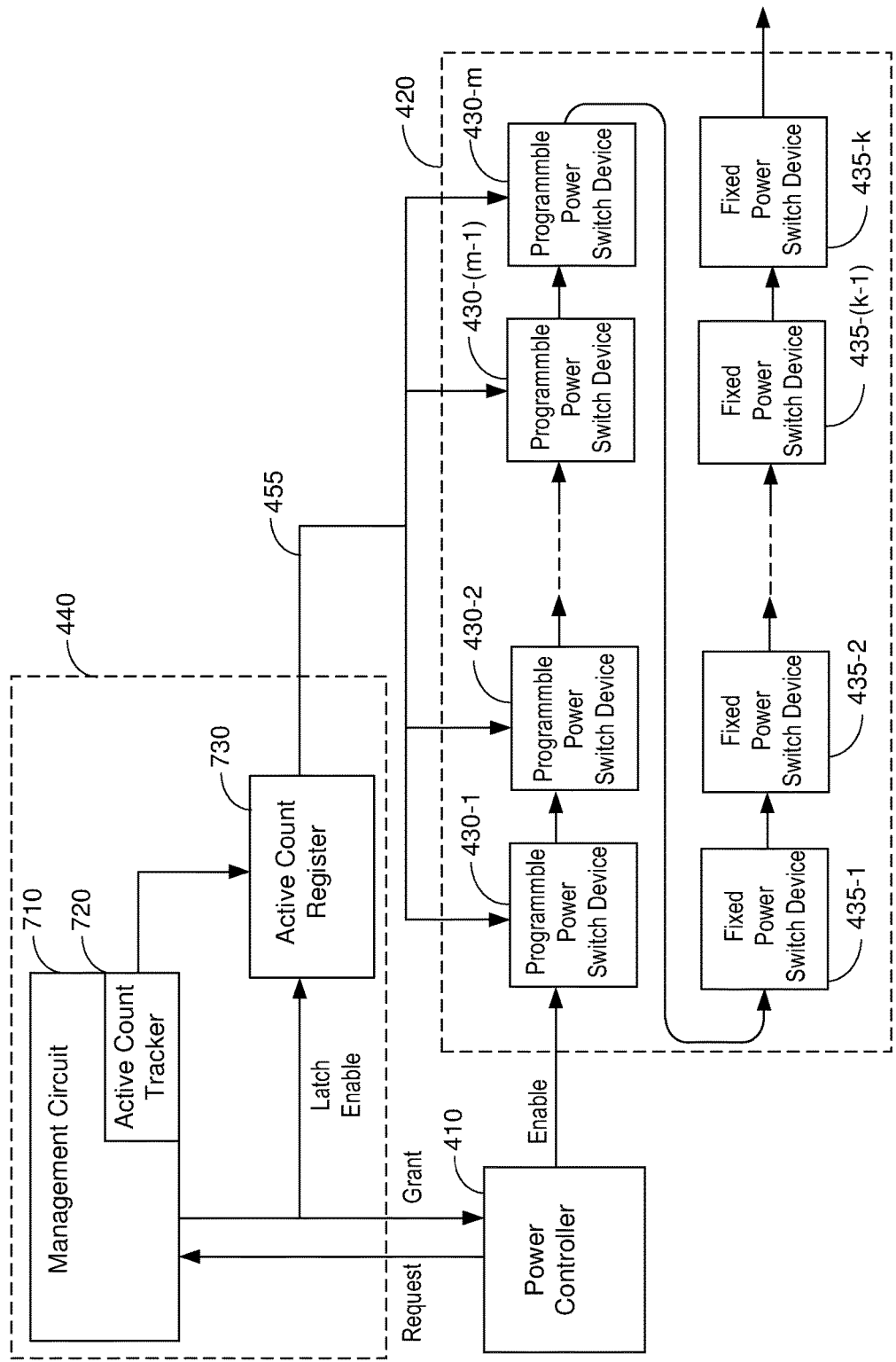
FIG. 7 shows an exemplary implementation of a power switch manager according to certain aspects of the present disclosure.

FIG. 7 shows an exemplary implementation of the power switch manager 440 according to certain aspects of the present disclosure. In this example, the power switch manager 440 includes a management circuit 710, an active count tracker 720, and an active count register 730. The active count tracker 720 is configured to track the number of circuit blocks in the system 110 that are active, and generate an active count indicating the number of active circuit blocks. In this regard, the management circuit 710 may be configured to increment the active count in the active count tracker 720 when a block circuit in the system 110 is powered-up (i.e., the power switches in the respective power-switching circuit are turned on). The management circuit 710 may decrement the active count in the active count tracker 720 when a block circuit in the system 110 is power collapsed (i.e., the power switches in the respective power switching-circuit are turned off). The active count register 730 is configured to receive the current active count from the active count tracker 720, and program the delays of the programmable power switch devices 430-1 to 430-$m$ of the power-switching circuit 420 based on the current active count, as discussed further below.

In operation, when the respective circuit block is to be woken up (i.e., powered up) from the power collapsed mode, the power controller 410 sends a power-up request to the management circuit 710 to wake up the respective circuit block. The decision to wake up the respective circuit block may come from power management software and/or hardware (not shown) based on, for example, the processing needs of application(s) running on the system 110.

In response to the request, the management circuit 710 may grant the request by sending a grant to the power controller 410 to initiate power-up of the respective circuit block. The management circuit 710 may also send a command to the active count register 730 to latch the current active count from the active count tracker 720 in the active count register 730. In one example, the command to latch the current active count may be the grant sent from the management circuit 710 to the power controller 410. In this example, the grant serves the dual purpose of granting the power controller 410 permission to initiate power-up of the respective circuit block and latching the current active count in the active count register 730. The active count register 730 may hold the latched active count until the next request/grant exchange for the respective circuit block.

The active count register 730 outputs the latched active count as the control signal 455 to the programmable power switch devices 430-1 to 430-*m* to program the delays of the programmable power switch devices 430-1 to 430-*m* based on the active count. For example, for the example in which each programmable power switch device 430-1 to 430-*m* includes the exemplary programmable delay buffer 520 shown in FIG. 6, the multiplexer 620 in the programmable delay buffer 520 of each programmable power switch device selects the delay path corresponding to the active count from the active count register 730.

In response to the grant from the management circuit 710, the power controller 410 initiates power-up of the respective circuit block. The power controller 410 may initiate power-up by outputting the enable signal to the first power switch device 430-1 in the daisy chain. As discussed above, the enable signal sequentially turns on the power switch devices 430-1 to 430-*m* and 435-1 to 435-*k* in the daisy chain as the enable signal propagates through the daisy chain. In certain aspects, the last power switch device 435-*k* may output the enable to the power controller 410 after the enable signal has propagated through the entire daisy chain to signal to the power controller 410 that all of the power switch devices 430-1 to 430-*m* and 435-1 to 435-*k* have been turned on. For the example in which the power switches in the power switch devices 430-1 to 430-*m* and 435-1 to 435-*k* are implemented with PFETs, the enable signal may have a logic value of zero.

After sending the grant, the management circuit 710 may increment the active count in the active count tracker 720. This is done to update the active count to include the respective block circuit as one of the active circuits. In one example, the power controller 410 may send a signal to the management circuit 710 indicating when power-up of the respective block circuit is complete, and the management circuit 710 may increment the active count in the active count tracker 720 in response to the signal. Note that the active count register 730 latches the active count before the active count is updated so that the active count in the active count register reflects the number of active circuit blocks at the time power-up of the respective circuit block is initiated.

The power controller 410 and the power switch manager 440 may also use a request/grant exchange to power down (i.e., power collapse) the respective circuit block from the active mode to the power collapsed mode. For example, when the respective circuit block is to be powered down from the active mode, the power controller 410 sends a power-down request to the management circuit 710 to power down the respective circuit block. In response to the request, the management circuit 710 may grant the request by sending a grant to the power controller 410 to initiate power-down of the respective circuit block. The management circuit 710 may also send a command to the active count register 730 to latch the current active count from the active count tracker 720. In one example, the command to latch the current active count may be the grant from the management circuit 710, in which case the grant serves the dual purpose of granting the power controller 410 permission to initiate power-down of the respective circuit block and latching the current active count in the active count register 730. The active count register 730 may hold the latched active count until the next request/grant exchange for the respective circuit block. In the case of power down, active count may be decremented first in the active count tracker 720, then grant/latch enable is asserted so as not to count the circuit block that would be undergoing power collapse as active.

Before sending the grant, the management circuit 710 may decrement the active count in the active count tracker 720. This is done to update the active count so the respective block circuit which would be undergoing power collapse should no longer be included as one of the active circuits. The active count register 730 outputs the latched active count to the programmable power switch devices 430-1 to 430-*m* in the power-switching circuit 420 to program the delays of the programmable power switch devices 430-1 to 430-*m*.

In response to the grant from the management circuit 710, the power controller 410 initiates power-down of the respective circuit block. The power controller 410 may initiate power-down by outputting the disable signal to the first power switch device 430-1 in the daisy chain. For the example in which the power switches in the power switch devices 430-1 to 430-*m* and 435-1 to 435-*k* are implemented with PFETs, the disable signal may have a logic value of one.

Figure 8:
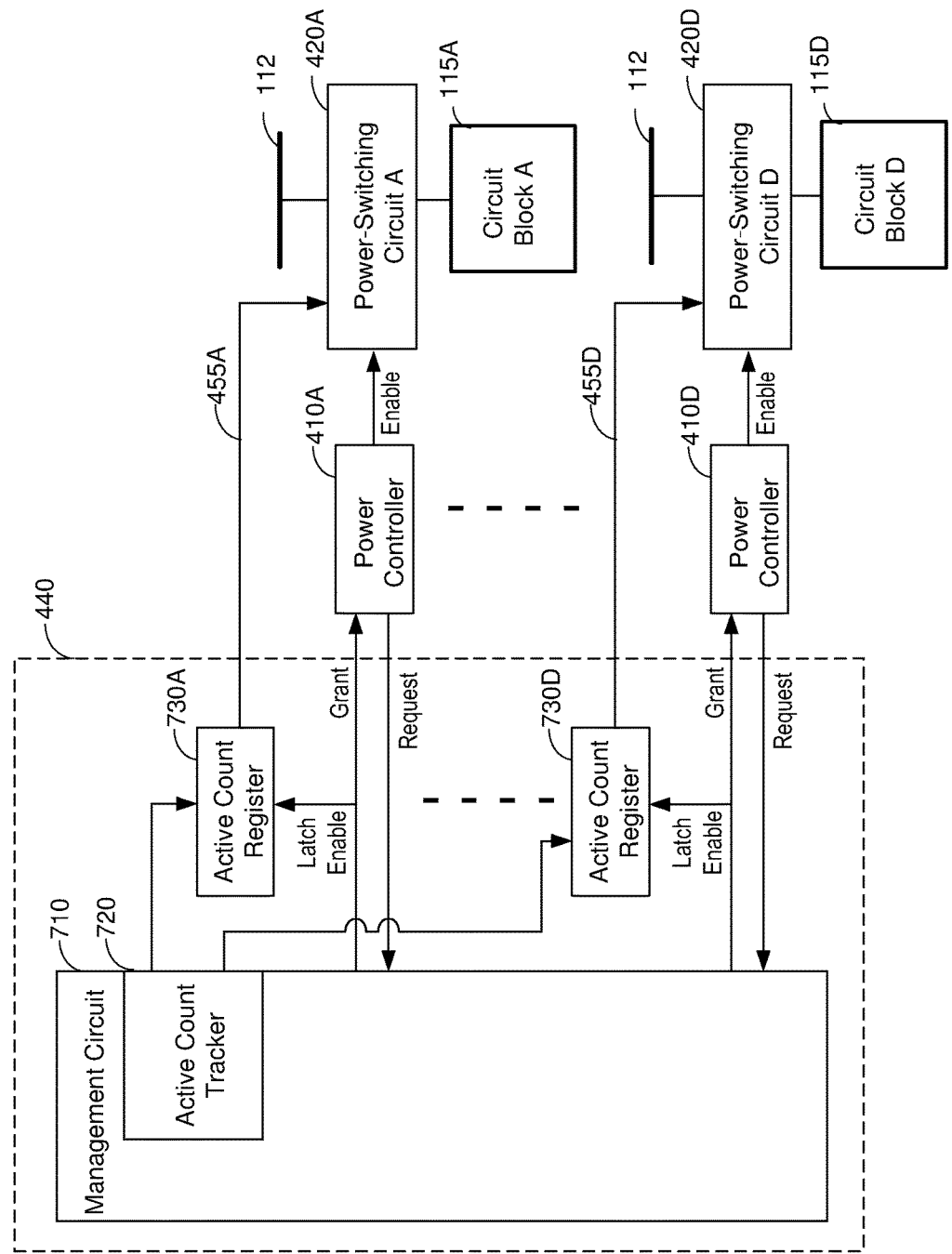
FIG. 8 shows an example in which the power switch manager is coupled to multiple power-switching circuits according to certain aspects of the present disclosure.

The power switch manager 440 may program switch delays for each of the circuit blocks 115A to 115D (e.g., processor cores). In this regard, FIG. 8 shows the power switch manager 440 coupled to the power-switching circuit 420A to 420D for each of the circuit blocks 115A to 115D. Each power-switching circuit 420A to 420D may be implemented with the exemplary power-switching circuit 420 shown in FIG. 4 (i.e., each power-switching circuit 420A to 420D is a separate instance of the power-switching circuit 420 in FIG. 4). The power switches in each power-switching circuit 420A to 420D are coupled between the shared supply rail 112 and the respective circuit block 115A to 115D.

In the example in FIG. 8, each circuit block 115A to 115D has its own power controller 410A to 410D for controlling power to the circuit block. Each power controller 410A to 410D is configured to interact with the power switch manager 440 before initiating power-up or power-down of the respective circuit block. For example, each power controller 410A to 410D may send a request to the power switch manager 440 when the respective block circuit is to be powered up or powered down, and initiate power-up or power-down of the respective block circuit upon receiving a grant of the request from the power switch manager 440.

In the example in FIG. 8, the power switch manager 440 includes a separate active count register 730A to 730D for each circuit block 115A to 115D. Each active count register 730A to 730D is configured to latch the active count from the active count tracker 720 in response to a respective command from the management circuit 710.

In operation, when the power switch manager 440 receives a power-up or power-down request from one of the power controllers 410A to 410D, the power switch manager 440 sends a grant to the power controller to initiate power-up or power-down of the respective circuit block. The management circuit 710 may also send a command to the respective active count register (i.e., respective one of active count registers 730A to 730D) to latch the current active count from the active count tracker 720 in the respective active count register. In one example, the command to latch the current active count is also the grant sent from the management circuit 710 to the power controller. The respective active count register may hold the latched active count until the next request/grant exchange for the respective circuit block. The respective active count register 730 outputs the latched active count as the control signal 455 to the programmable power switch devices 430-1 to 430-*m* in the respective power-switching circuit to program the delays of the programmable power switch devices 430-1 to 430-*m* based on the active count.

In response to the grant from the management circuit 710, the power controller initiates power-up or power-down of the respective circuit block. The power controller 410 may initiate power-up by outputting the enable signal to the first power switch device 430-1 in the respective power-switching circuit or initiate power-down by outputting the disable signal to the first power switch device 430-1 in the respective power-switching circuit.

After sending the grant, the management circuit 710 may increment the active count in the active count tracker 720 if the respective circuit block is being powered-up or before sending the grant, the management circuit 710 may decrement the active count in the active count tracker 720 if the respective circuit block is being powered down.

In certain aspects, the power switch manager 440 is configured to only grant one request for power-up or power-down at a time. In these aspects, if the power switch manager 440 receives requests from two or more of the power controllers 410A to 410D, then the management circuit 710 grants the requests one at a time. For example, if the power switch manager 440 receives power-up requests from first and second ones of the power controllers 410A to 410D, then the management circuit 710 may grant the request to the first power controller, and wait until the circuit block corresponding to the first power controller is powered up before granting the request to the second power controller.

At the start of a cold boot all of the circuit blocks 115A to 115D may be initially power collapsed, or if multiple collapsed circuits want to wake-up at same time (because of simultaneous wake-up interrupts), the power switch manager 440 may receive a power-up request from each of the power controllers 410A to 410D. In response to the requests, the power switch manager 440 may grant the requests one at a time so that the circuit blocks 115A to 115D are powered up one at a time (i.e., powered up sequentially). The mechanism of staggering/sequentially assigning the grants to power controllers is needed to manage the inrush current.

For example, the management circuit 710 may first grant the request from the power controller for a first one of the circuit blocks 115A to 115D. In this example, the active count register for the first circuit block latches the current active count from the active count tracker 720, which is zero since all of the circuit blocks are initially power collapsed. As a result, the programmable power switch devices in the respective power-switching circuit are programmed based on an active count of zero. In response to the grant, the power controller for the circuit block initiates power-up of the first circuit block. The management circuit 710 also increments the active count in the active count tracker 720 to a count value of one.

After the first circuit block is powered up, the management circuit 710 may then grant the request from the power controller for a second one of the circuit blocks 115A to 115D. The active count register for the second circuit block latches the current active count value from the active count tracker 720, which is one. As a result, the programmable power switch devices in the respective power-switching circuit are programmed based on an active count of one. In response to the grant, the power controller for the second circuit block initiates power-up of the second circuit block. The management circuit 710 also increments the active count in the active count tracker 720 to a count value of two.

After the second circuit block is powered up, the management circuit 710 may then grant the request from the power controller for a third one of the circuit blocks 115A to 115D. The active count register for the third circuit block latches the current active count value from the active count tracker 720, which is two. As a result, the programmable power switch devices in the respective power-switching circuit are programmed based on an active count of two. In response to the grant, the power controller for the third circuit block initiates power-up of the third circuit block. The management circuit 710 also increments the active count in the active count tracker 720 to a count value of three.

After the third circuit block is powered up, the management circuit 710 may then grant the request from the power controller for a fourth one of the circuit blocks 115A to 115D. The active count register for the fourth circuit block latches the current active count value of the active count tracker 720, which is three. As a result, the programmable power switch devices in the respective power-switching circuit are programmed based on an active count of three. In response to the grant, the power controller for the fourth circuit block initiates power-up of the fourth circuit block.

Thus, for the case of a cold boot, the power switch manager 440 powers up the circuit blocks 115A to 115D sequentially. In addition, the power switch manager 440 programs a shorter wake-up time for each subsequent circuit block that is powered up during the cold boot. This assumes that the active count of the active count tracker 720 increases as more circuit blocks are powered up, and shorter switch delays are programmed for higher active counts. The reduction in the wake-up time for each subsequent circuit block reduces the overall time (i.e., latency) of the cold boot. Thus, the power switch manager 440 speeds up the cold boot by reducing the wake-up time for each subsequent circuit block that is powered up during the cold boot.

Figure 9:
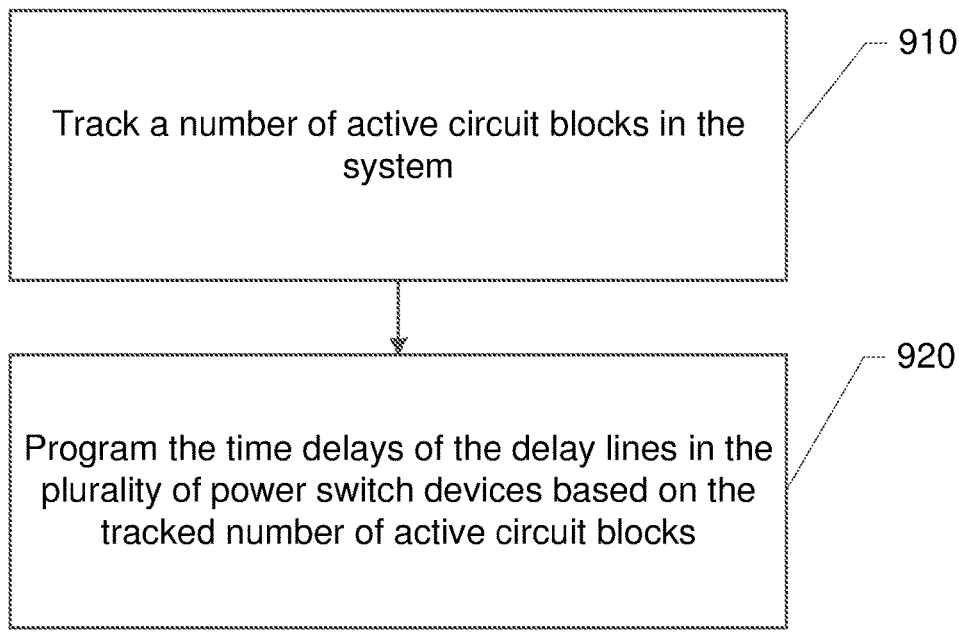
FIG. 9 is a flowchart showing a method for programming power switch delays in a system according to certain aspects of the present disclosure.

FIG. 9 shows an exemplary method 900 for programming power switch delays in a system, wherein the system includes a plurality of power switch devices, each of the plurality of power switch devices including a delay line having a programmable time delay and a power switch coupled between a supply rail and a circuit block. The plurality of power switch devices may correspond to programmable power switch devices 430-1 to 430-*m*, and the circuit block may correspond to one of the circuit blocks 115A to 115D. The delay line of each power switch device may include a programmable delay buffer that provides programmability of the time delay of the delay line.

At block 910, a number of active circuit blocks in the system is tracked. For example, the number of active circuit blocks may be tracked using an active count that is incremented when a circuit block in the system is powered up and decremented when a circuit block in the system is powered down.

At block 920, the time delays of the delay lines in the plurality of power switch devices are programmed based on the tracked number of active circuit blocks. For example, the time delay of at least one of the delay lines may be programmed to be equal to a first delay if the number of active circuit blocks is equal to a first number, and the time delay of the at least one of the delay lines may be programmed to be equal to a second delay if the number of active circuit blocks is equal to a second number. In this example, the first delay is shorter than the second delay, and the first number is higher than the second number.

The power switch manager 440 and the management circuit 710 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus comprising:
   a first plurality of power switch devices, wherein each of the first plurality of power switch devices comprises:
     a delay line having a programmable time delay; and
     a power switch coupled between a supply rail and a circuit block,
     wherein the power switch has a control input coupled to the delay line; and
   a switch manager configured to program the time delays of the delay lines in the first plurality of power switch devices based on a number of active circuit blocks in a system.

2. The apparatus of claim 1, wherein the power switch in each of the first plurality of power switch devices comprises:
   a transistor coupled between the supply rail and the circuit block, wherein the control input of the power switch comprises a gate of the transistor.

3. The apparatus of claim 1, wherein the delay lines in the first plurality of power switch devices are coupled in series to form a daisy chain.

4. The apparatus of claim 1, further comprising:
   a second plurality of power switch devices, wherein each of the second plurality of power switch devices comprises:
     a delay line having a non-programmable time delay; and
     a power switch coupled between the supply rail and the circuit block,
     wherein the power switch has a control input coupled to the delay line;
   wherein the delay lines in the first plurality of power switch devices and the delay lines in the second plurality of power switch devices are coupled in series to form a daisy chain.

5. The apparatus of claim 4, wherein the first plurality of power switch devices precedes the second plurality of power switch devices in the daisy chain.

6. The apparatus of claim 1, further comprising a power controller configured to initiate power-up of the circuit block by outputting an enable signal to a first one of the first plurality of power switch devices.

7. The apparatus of claim 6, wherein:
   the power controller is configured to send a request to the switch manager to power-up the circuit block;
   the switch manager is configured to program the time delays of the delay lines in the first plurality of power switch devices in response to the request;
   the switch manager is configured to send a grant of the request to the power controller; and
   the power controller is configured to initiate the power-up of the circuit block in response to the grant.

8. The apparatus of claim 1, wherein the switch manager is configured to:
   program the time delay of at least one of the delay lines to be equal to a first delay if the number of active circuit blocks is equal to a first number; and
   program the time delay of the at least one of the delay lines to be equal to a second delay if the number of active circuit blocks is equal to a second number;
   wherein the first delay is shorter than the second delay, and the first number is higher than the second number.

9. The apparatus of claim 1, wherein the switch manager comprises:
   an active count tracker configured to generate an active count indicating the number of active circuit blocks in the system;
   an active count register configured to receive the active count from the active count tracker; and
   a management circuit configured to cause the active count register to latch the received active count;
   wherein the active count register is further configured to output the latched active count to the delay lines in the first plurality of power switch devices to program the time delays of the delay lines in the first plurality of power switch devices.

10. The apparatus of claim 9, wherein the management circuit is configured to increment the active count in the active count tracker when a circuit block in the system is powered up.

11. The apparatus of claim 10, wherein the management circuit is configured to decrement the active count in the active count tracker when a circuit block in the system is powered down.

12. The apparatus of claim 9, wherein the delay line in each of the first plurality of power switch devices comprises:

a programmable delay buffer comprising:
  a plurality of delay paths; and
  a multiplexer configured to receive the latched active count from the active count register, and to select one of the plurality of delay paths based on the latched active count.

13. The apparatus of claim 1, wherein the circuit block comprises a processor core and the active circuit blocks comprise active processor cores.

14. The apparatus of claim 1, wherein the circuit block and the active circuit blocks share the supply rail.

15. A method for programming power switch delays in a system, wherein the system includes a plurality of power switch devices, each of the plurality of power switch devices comprising a delay line having a programmable time delay and a power switch coupled between a supply rail and a circuit block, wherein the power switch has a control input coupled to the delay line, the method comprising:
  tracking a number of active circuit blocks in the system; and
  programming the time delays of the delay lines in the plurality of power switch devices based on the tracked number of active circuit blocks.

16. The method of claim 15, wherein programming the time delays of the delay lines comprises:
  programming the time delay of at least one of the delay lines to be equal to a first delay if the number of active circuit blocks is equal to a first number; and
  programming the time delay of the at least one of the delay lines to be equal to a second delay if the number of active circuit blocks is equal to a second number;
  wherein the first delay is shorter than the second delay, and the first number is higher than the second number.

17. The method of claim 15, wherein the delay lines in the plurality of power switch devices are coupled in series to form a daisy chain.

18. The method of claim 17, further comprising initiating power-up of the circuit block by outputting an enable signal to a first one of the first plurality of power switch devices.

19. The method of claim 15, wherein:
  tracking the number of active circuit blocks in the system comprises generating an active count indicating the tracked number of active circuit blocks; and
  programming the time delays of the delay lines in the plurality of power switch devices comprises:
    latching the active count; and
    outputting the latched active count to the delay lines in the plurality of power switch devices.

20. The method of claim 19, wherein tracking the number of active circuit blocks comprises incrementing the active count when a circuit block in the system is powered up.

21. The method of claim 20, wherein tracking the number of active circuit blocks comprises decrementing the active count when a circuit block in the system is powered down.

\* \* \* \* \*